United States Patent
Nakao et al.

(10) Patent No.: US 11,605,272 B2
(45) Date of Patent: Mar. 14, 2023

(54) ACTUATOR AND TACTILE SENSATION PROVIDING APPARATUS

(71) Applicant: KYOCERA Corporation, Kyoto (JP)

(72) Inventors: Fumiaki Nakao, Kawasaki (JP); Shigeto Hattori, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/294,508

(22) PCT Filed: Nov. 11, 2019

(86) PCT No.: PCT/JP2019/044158
§ 371 (c)(1),
(2) Date: May 17, 2021

(87) PCT Pub. No.: WO2020/105495
PCT Pub. Date: May 28, 2020

(65) Prior Publication Data
US 2022/0020250 A1 Jan. 20, 2022

(30) Foreign Application Priority Data
Nov. 22, 2018 (JP) .............................. JP2018-219534

(51) Int. Cl.
*G06F 3/01* (2006.01)
*G08B 6/00* (2006.01)

(52) U.S. Cl.
CPC .............. *G08B 6/00* (2013.01); *G06F 3/016* (2013.01)

(58) Field of Classification Search
CPC ....................................................... G08B 6/00
USPC ......................................................... 340/407.2
See application file for complete search history.

(56) References Cited

U.S. PATENT DOCUMENTS

| 9,348,414 B2 | 5/2016 | Kagayama |
| 2006/0022180 A1* | 2/2006 | Selness ................ A47B 91/028 254/104 |
| 2013/0323085 A1* | 12/2013 | Hirata ................... F04B 43/046 417/413.1 |
| 2015/0139457 A1* | 5/2015 | Onishi ................. H04R 1/2819 381/190 |
| 2017/0226994 A1* | 8/2017 | Richter ................. H01L 41/311 |
| 2018/0317020 A1* | 11/2018 | Abe ....................... H04R 1/283 |
| 2019/0074425 A1 | 3/2019 | Nakao |
| 2021/0312770 A1* | 10/2021 | Nakao ..................... G06F 3/016 |

FOREIGN PATENT DOCUMENTS

| JP | 2012-181771 A | 9/2012 |
| JP | 2017-175874 A | 9/2017 |
| WO | 2013099743 A1 | 7/2013 |

* cited by examiner

*Primary Examiner* — Jack K Wang
(74) *Attorney, Agent, or Firm* — Studebaker & Brackett PC

(57) ABSTRACT

Provided is an actuator having a piezoelectric element, a diaphragm to which the piezoelectric element is bonded and vibrates according to expansion and contraction displacement of the piezoelectric element, and a first spacer and a second spacer configured to fix both ends of the diaphragm in expansion and contraction displacement direction of the piezoelectric element to a base member. The driving characteristics of the actuator are determined by an effective length of the diaphragm between the first spacer and the second spacer.

16 Claims, 12 Drawing Sheets

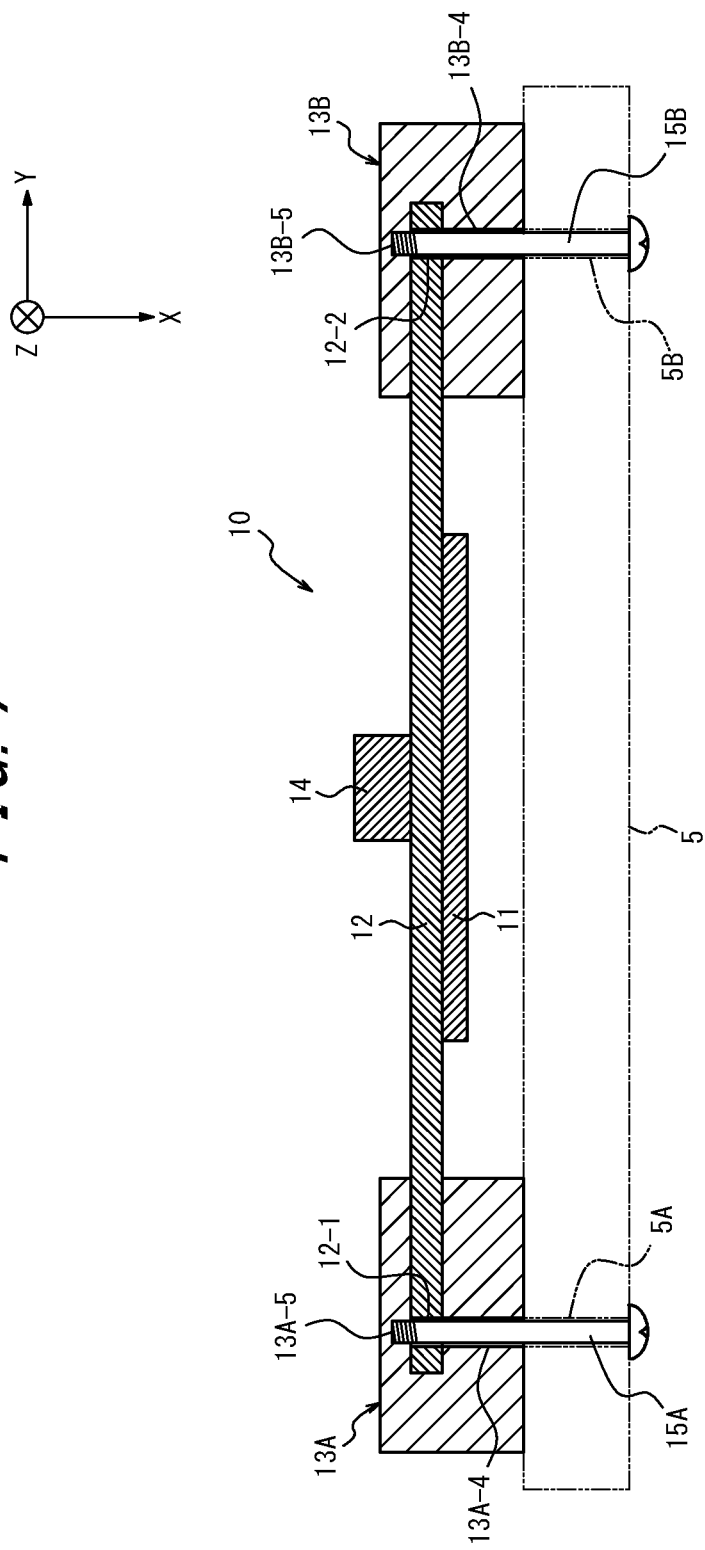

ACTUATOR AND TACTILE SENSATION PROVIDING APPARATUS

CROSS-REFERENCE TO RELATED APPLICATION

This application claims priority to and benefit of Japanese Patent Application No. 2018-219534 filed on Nov. 22, 2018, the entire contents of which are incorporated herein by reference.

TECHNICAL FIELD

This disclosure relates to actuators and tactile sensation providing apparatuses.

BACKGROUND

A device that provides tactile sensation to a user is known. In a known tactile sensation providing apparatus tactile sensation is provided to a user who touches a vibration object by vibrating the vibration object such as a touch sensor by an actuator.

SUMMARY

An actuator according to an aspect has a piezoelectric element, a diaphragm to which the piezoelectric element is bonded, and which vibrates according to expansion and contraction displacement of the piezoelectric element, and a first spacer and a second spacer configured to fix both ends of the diaphragm in the expansion and contraction displacement direction of the piezoelectric element to a base member. The driving characteristics of the actuator are determined by the effective length of the diaphragm between the first spacer and the second spacer.

A tactile sensation providing apparatus according to an aspect includes a vibration object configured to provide tactile sensation and an actuator. The actuator has a piezoelectric element, a diaphragm to which the piezoelectric element is bonded, and which vibrates according to expansion and contraction displacement of the piezoelectric element, and a first spacer and a second spacer configured to fix both ends of the diaphragm in the expansion and contraction displacement direction of the piezoelectric element to a base member. The driving characteristics of the actuator are determined by the effective length of the diaphragm between the first spacer and the second spacer.

BRIEF DESCRIPTION OF THE DRAWINGS

In the accompanying drawings:

FIG. 7 is a cross-sectional view of the actuator:

DETAILED DESCRIPTION

In the tactile sensation providing apparatus, when an attempt is made to install a dedicated actuator that is optimally designed for each specification of the vibration object, it may cause an increase in the cost of the actuator and the tactile sensation providing apparatus. This disclosure can provide an actuator that has a great versatility and can reduce cost and a tactile sensation providing apparatus that uses the actuator.

Embodiments according to this disclosure will be described below with reference to drawings. Hereinafter, the common components in each figure are designated by the same reference signs. The figures used in the following description are schematic. The dimensional ratio of the drawings may be different from the actual ratio.

First Embodiment

[Configuration Example of the Tactile Sensation Providing Apparatus]

Figure 1:
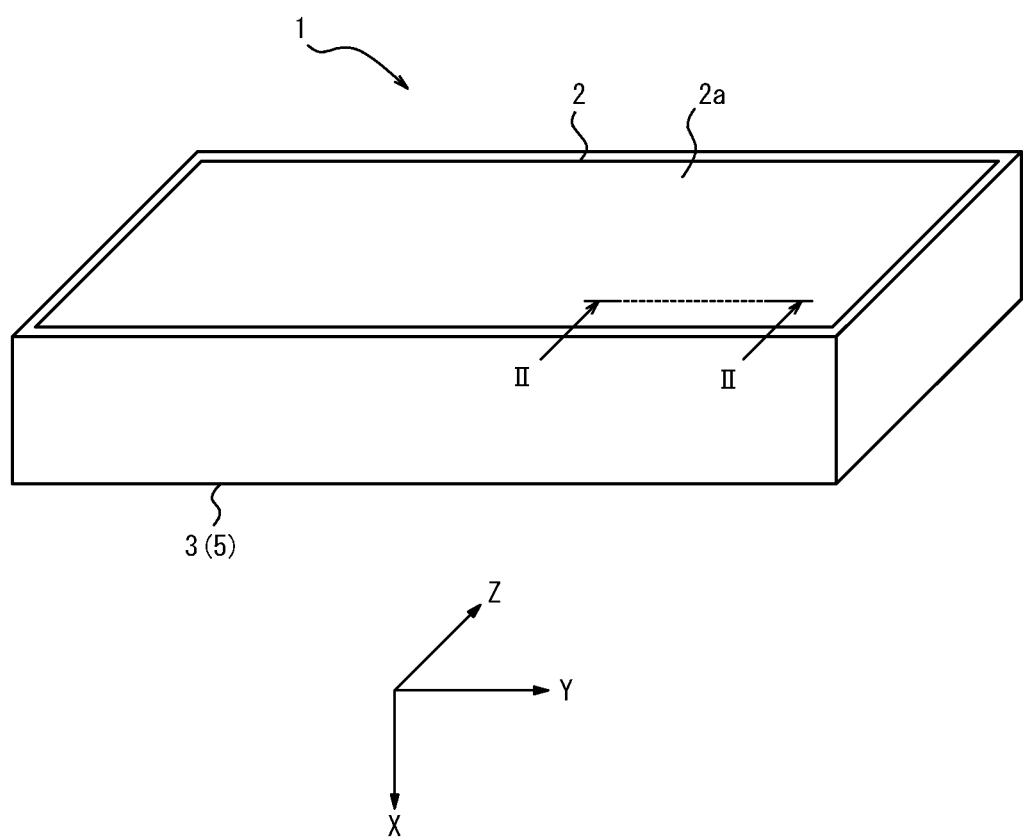
FIG. 1 is a diagram illustrating an external configuration of a tactile sensation providing apparatus.
Figure 2:
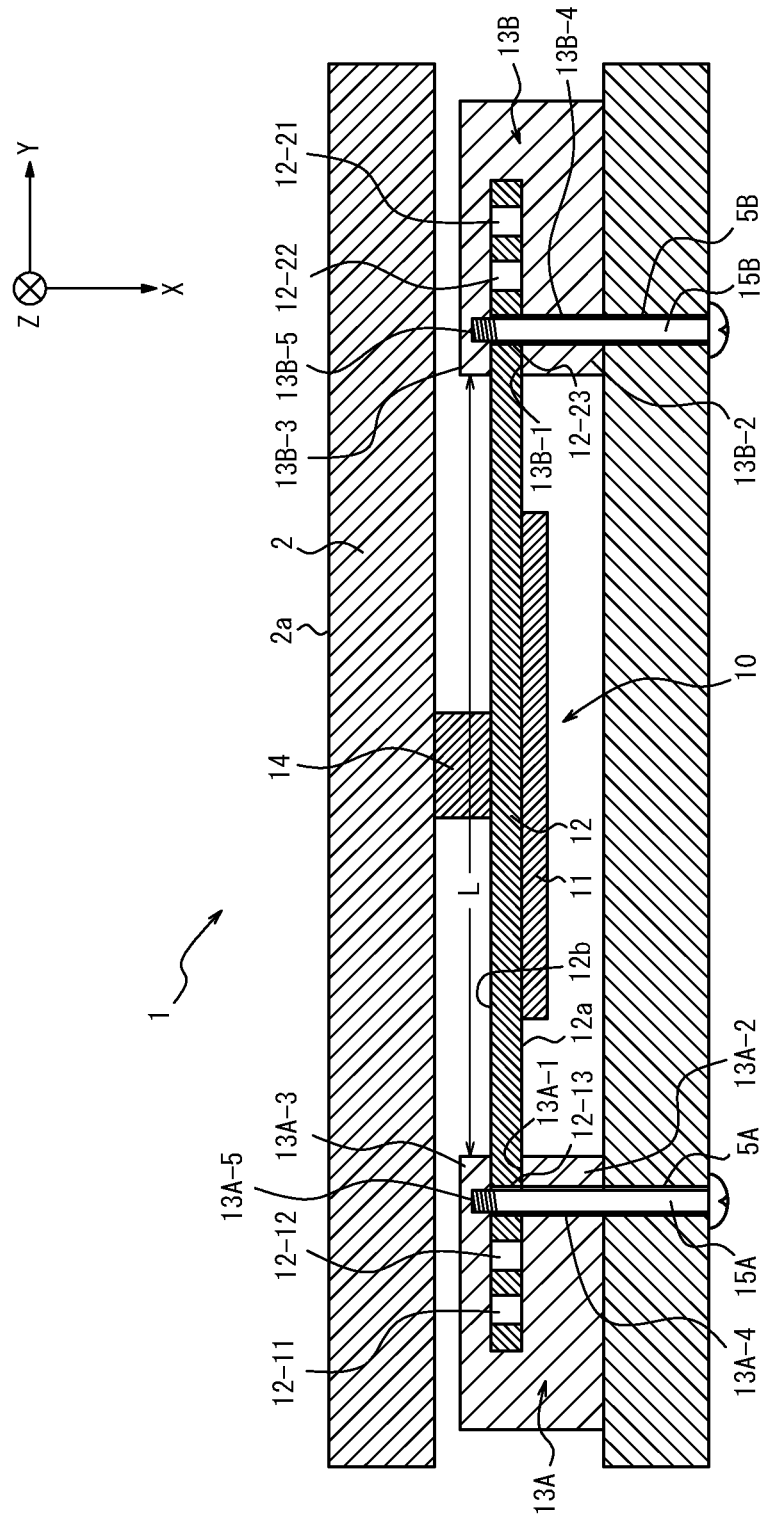
FIG. 2 is a cross-sectional view of the tactile sensation providing apparatus.

FIG. 1 is a diagram illustrating an external configuration of a tactile sensation providing apparatus 1 according to a first embodiment of this disclosure. FIG. 2 is an XY plane cross sectional view of the tactile sensation providing apparatus 1 taken along II-II line in FIG. 1. The tactile sensation providing apparatus 1 illustrated in FIG. 1 has a rectangular parallelepiped shape in appearance. In FIGS. 1 and 2, the thickness direction of the tactile sensation providing apparatus 1 is the X-axis direction. The longitudinal direction of the tactile sensation providing apparatus 1 is the Y-axis direction. The lateral direction of the tactile sensation providing apparatus 1 is the Z-axis direction.

The tactile sensation providing apparatus 1 vibrates a vibration object 2 to provide tactile sensation to a user who touches a main face 2a of the vibration object 2. Examples of the tactile sensation providing apparatus 1 include car navigation systems or in-vehicle devices such as steering or power window switches. Further, examples of the tactile sensation providing apparatus 1 include mobile phones, smartphones, tablet Personal Computers (PCs) and notebook PCs. The tactile sensation providing apparatus 1 is not limited to them. The tactile sensation providing apparatus 1 may be a desktop PC, a home electric appliance, an industrial device (Factory Automation (FA) device), a dedicated terminal, various electronic devices, or the like As illustrated in FIGS. 1 and 2, the tactile sensation providing apparatus 1 includes a vibration object 2, a housing 3 and an actuator 10.

The vibration object 2 has a main face 2a. The user touches the main face 2a with a finger or the like. The vibration object 2 may be a touch sensor disposed in a display panel. The vibration object 2 is not limited to a touch sensor. For example, the vibration object 2 may be a switch. Vibration of the actuator 10 is transmitted to the vibration object 2. The vibration object 2 vibrates when vibration of the actuator 10 is transmitted to it.

A vibrating direction of the vibration object 2 includes, for example, an in-plane direction and an out-of-plane direction. The in-plane direction is the direction substantially parallel to the main face 2a of the vibration object 2. In FIG. 1, the in-plane direction is the direction substantially parallel to the ZY plane. In FIG. 1, the vibration in the in-plane direction is the vibration in the Z-axis direction, for example. The out-of-plane direction is the direction that intersects the main face 2a of the vibration object 2. In FIG. 1, the vibration in the out-of-plane direction is the vibration in the X-axis direction, for example. Hereinafter, the vibration in the in-plane direction is referred to as the "horizontal vibration." Further, the vibration in the out-of-plane direction is referred to as the "vertical vibration."

The housing 3 may be made of metal, synthetic resin, or the like. The housing 3 protects the internal structure of tactile sensation providing apparatus 1. The internal structure of the tactile sensation providing apparatus 1 is directly or indirectly supported by the housing 3 or a support member fixed to the housing 3. The housing 3 or the support member fixed to the housing 3 functions as the base member 5. The housing 3 may contain the actuator 10, a controller, a memory, and the like. The controller may be configured by a processor or a microcomputer capable of executing application software. The controller is connected to the actuator 10. The controller outputs a drive signal to vibrate the actuator 10 to the actuator 10. The drive signal may be a voltage signal or a current signal. The memory may be a semiconductor memory, a magnetic memory, or the like. The memory stores various information and programs for operating the controller. It is to be noted that the controller and the memory may be provided outside the housing 3.

As illustrated in FIG. 2, the actuator 10 is disposed between the vibration object 2 and the base member 5. The actuator 10 may be disposed at each of four corners of the rectangular parallelepiped tactile sensation providing apparatus 1 illustrated in FIG. 1. The actuator 10 converts a drive signal output from the controller of the tactile sensation providing apparatus 1 into vibration. The vibration converted by the actuator 10 is transmitted to the vibration object 2. The actuator 10 vibrates the vibration object 2 vertically. It is to be noted that the actuator 10 may vibrate the vibration object 2 horizontally by changing the arrangement of the actuator 10 as appropriate.

[Configuration Example of Actuator]

Figure 3:
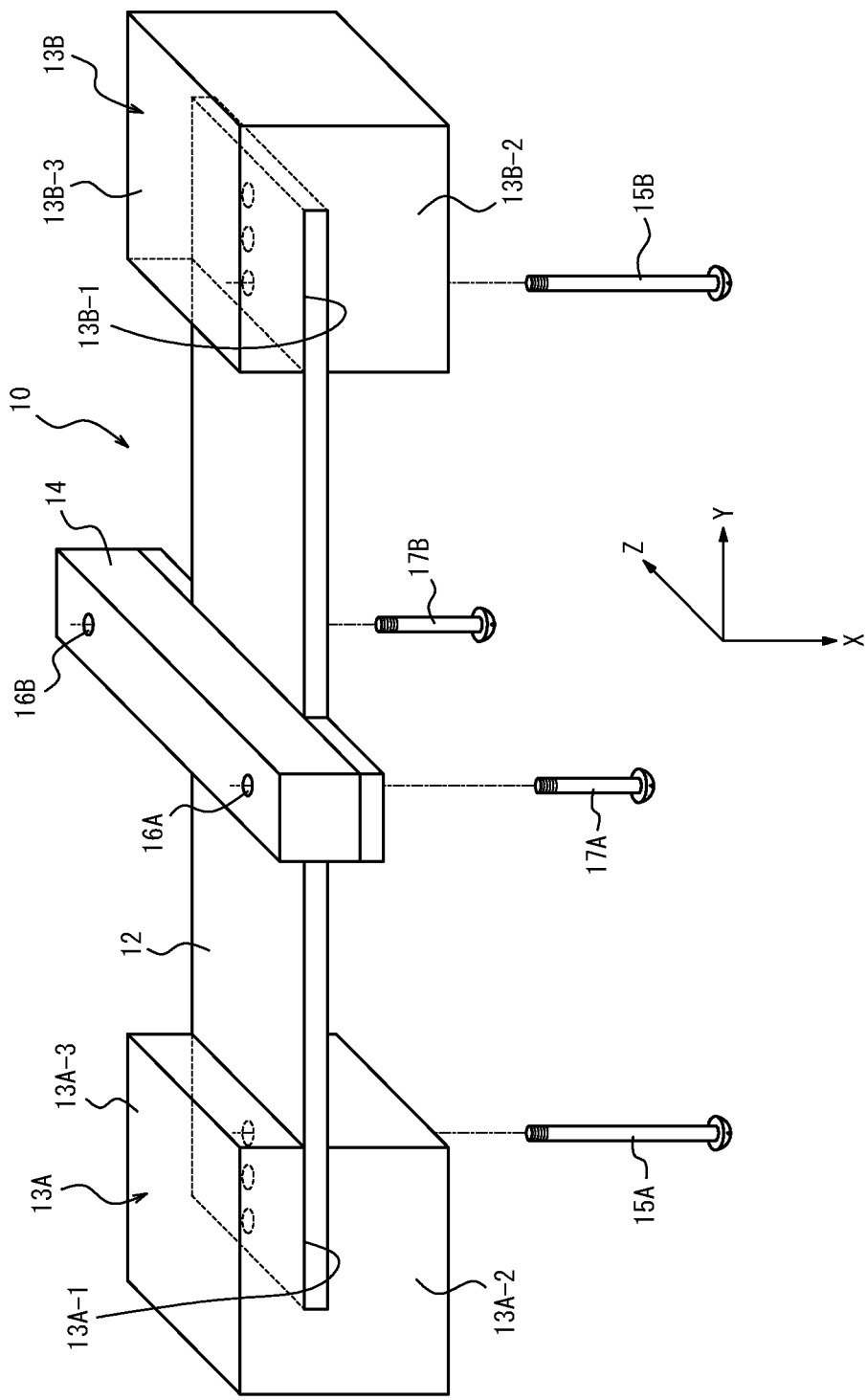
FIG. 3 is a perspective view of an actuator viewed from a vibration object side.
Figure 4:
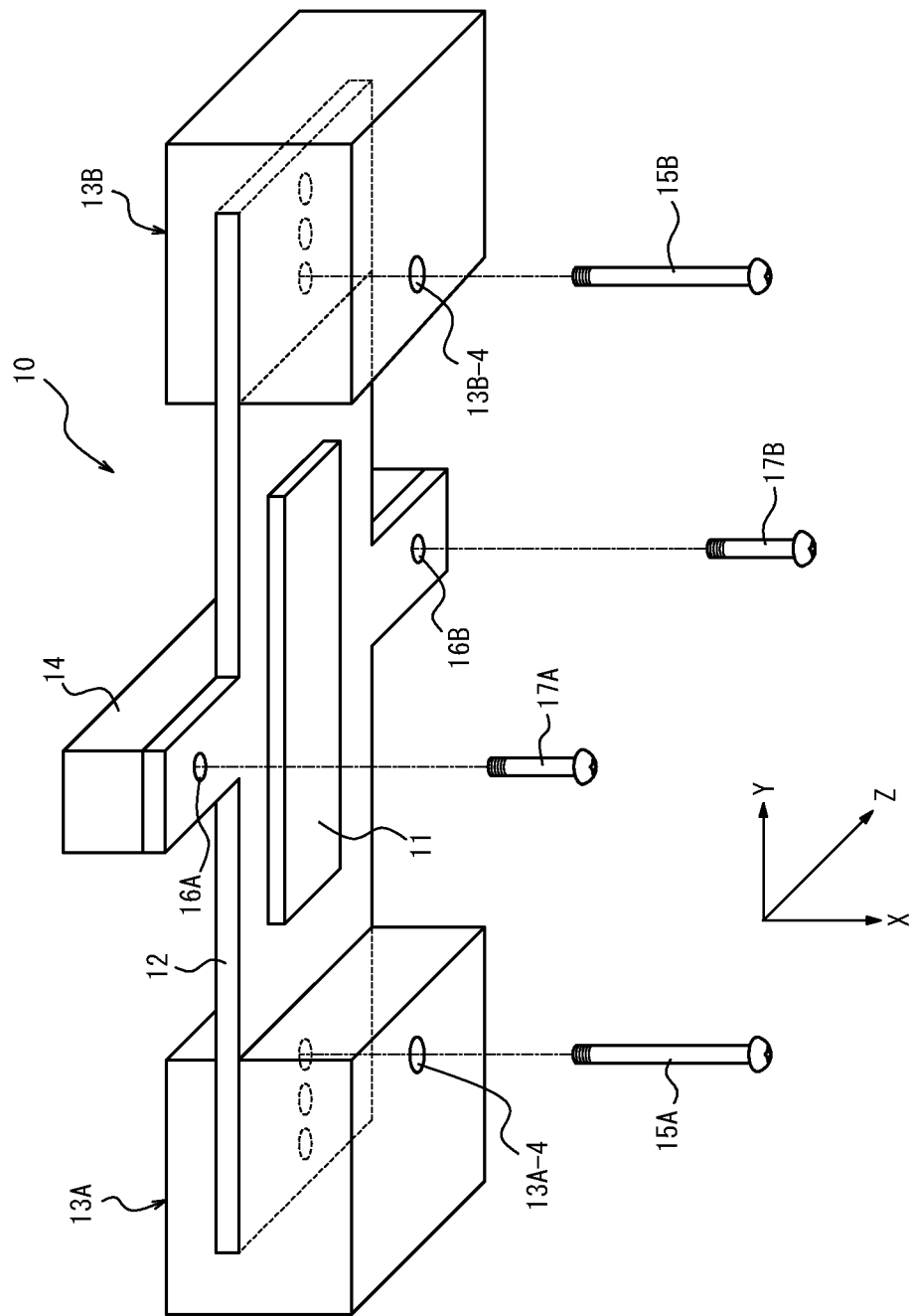
FIG. 4 is a perspective view of the actuator viewed from a base member side.

FIG. 3 is a perspective view of the actuator 10 illustrated in FIG. 2 viewed from the vibration object 2 side. FIG. 4 is a perspective view of the actuator 10 illustrated in FIG. 2 viewed from the base member 5 side.

The actuator 10 has a piezoelectric element 11, a diaphragm 12, a first spacer 13A, a second spacer 13B and a holder 14.

The piezoelectric element 11 is, for example, rectangular. A drive signal output by the controller of the tactile sensation providing apparatus 1 is applied to the piezoelectric element 11. The piezoelectric element 11 expands and contracts in the longitudinal direction according to the applied drive signal. The piezoelectric element 11 may be a piezoelectric film or a piezoelectric ceramic. The piezoelectric ceramic can generate vibration that has greater vibration energy than a piezoelectric film.

The piezoelectric element 11 may be replaced by a magnetostrictor. The magnetostrictor expands and contracts according to the applied magnetic field. When the piezoelectric element 11 is replaced by a magnetostrictor, the actuator 10 may have a coil or the like that converts a drive signal output by the controller of the tactile sensation providing apparatus 1 illustrated in FIG. 1 into a magnetic field.

The diaphragm 12 is a plate having elasticity, like a shim plate. The diaphragm 12 may be a plate-like member having a predetermined thickness. The diaphragm 12 may be formed of metal, resin, or a composite material of metal, resin, and the like. One end of the diaphragm 12 is fixed to the base member 5 via the first spacer 13A. The other end of the diaphragm 12 is fixed to the base member 5 via the second spacer 13B. Hereinafter, the face facing the base member 5 of the two faces included in the diaphragm 12 is also referred to as a "main face 12a.

The diaphragm 12 converts the expansion and contraction displacement of the piezoelectric element 11 into vibration in a predetermined direction. The main face 12a of the diaphragm 12 may be provided with the piezoelectric element 11. The piezoelectric element 11 may be provided on the main face 12a of the diaphragm 12 so that the longitudinal direction of the piezoelectric element 11 will coincide with the longitudinal direction of the diaphragm 12. The piezoelectric element 11 may be bonded to the main face 12a of the diaphragm 12 with an adhesive or the like. The structure in which the piezoelectric element 11 is provided on the main face 12a of the diaphragm 12 is a so-called unimorph. For example, when the piezoelectric element 11 expands and contracts, the diaphragm 12 vibrates so that the amplitude of the main face 12a in the normal direction will be maximized near the center of the diaphragm 12. In other words, the diaphragm 12 converts the expansion and contraction displacement of the piezoelectric element 11 into vibration of the main face 12a in the normal (X-axis) direction near the center of the diaphragm 12.

One end of the diaphragm 12 is formed with a plurality of through holes through which a fixing screw 15A for fixing the actuator 10 to the base member 5 can pass. In the same manner, the other end of the diaphragm 12 is formed with a plurality of through holes through which a fixing screw 15B for fixing the actuator 10 to the base member 5 can pass. In the actuator 10 of this disclosure, for example, at the center in the Z direction, one end of the diaphragm 12 is formed with three through holes 12-11, 12-12 and 12-13 disposed from the outside to the inside in the Y direction. In the same manner, for example, at the center in the Z direction, the other end of the diaphragm 12 is formed with three through holes 12-21, 12-22 and 12-23 disposed from the outside to the inside in the Y direction. The through holes 12-11, 12-12 and 12-13 and the through holes 12-21, 12-22 and 12-23 are formed symmetrical with respect to the piezoelectric element 11, at the center in the Z direction, for example.

The first spacer 13A is disposed at one end of the diaphragm 12 in the longitudinal direction. The first spacer 13A is formed in a U-shape having a recess 13A-1 and a pair of flat portions 13A-2 and 13A-3 facing each other through the recess 13A-1. One end of the diaphragm 12 is removably inserted into the recess 13A-1. A through hole 13A-4 through which the fixing screw 15A passes is formed in the flat portion 13A-2 located between the diaphragm 12 and the base member 5. A female thread 13A-5 into which a fixing screw 15A is screwed is formed, coaxially with the through hole 13A-4, in the flat portion 13A-3 located between the diaphragm 12 and the vibration object 2.

The second spacer 13B is configured in a U shape, like the first spacer 13A. The other end of the diaphragm 12 is removably inserted into the recess 13B-1 of the second spacer 13B. The flat portion 13B-2 located between the diaphragm 12 and the base member 5 is formed with a through hole 13B-4 through which the fixing screw 15B passes. The flat portion 13B-3 located between the diaphragm 12 and the vibration object 2 is formed, coaxially with the through hole 13A-4, with a female thread 13B-5 into which a fixing screw 15B is screwed.

The holder 14 holds the vibration object 2. The holder 14 may be formed of metal, resin, or composite material of metal, resin, and the like. The holder 14 is provided near the center of the main face 12b of the diaphragm 12. The holder 14 is bonded to the diaphragm 12 with an adhesive and the like. In FIGS. 2-4, the diaphragm 12 is formed such that its central portion is projected to both sides in the Z direction, and the holder 14 is provided over the length in the Z direction including the projection. The holder 14 is attached to the vibration object 2 by mounting screws 17A and 17B through screw holes 16A and 16B that pass through the diaphragm 12 and the holder 14, on both sides projecting in the Z direction at the central portion of the diaphragm 12. The holder 14 may be bonded to the vibration object 2 with an adhesive and the like.

As illustrated in FIG. 2, the fixing screw 15A passes through the through hole 5A formed in the base member 5, the through hole 13A-4 of the first spacer 13A and any one of the through holes 12-11, 12-12 and 12-13 at one end of the diaphragm 12, and is screwed into the female thread 13A-5 of the first spacer 13A. In the same manner, the fixing screw 15B passes through the through hole 5B formed in the base member 5, the through hole 13B-4 of the second spacer 13B and any one of the through holes 12-21, 12-22 and 12-23 at the other end of the diaphragm 12, and is screwed into the female thread 13B-5 of the second spacer 13B. The both ends of the diaphragm 12 are clamped by the first spacer 13A and the second spacer 13B, and the actuator 10 is fixed to the base member 5.

The first spacer 13A and the second spacer 13B support the diaphragm 12 so that a gap is created between the piezoelectric element 11 and the base member 5. When a gap is created between the piezoelectric element 11 and the base member 5, the piezoelectric element 11 can be prevented from colliding with the base member 5 when the diaphragm 12 vibrates according to the vibration of the piezoelectric element 11. The first spacer 13A and the second spacer 13B may be made of the same material as the diaphragm 12 or of the different material than the diaphragm 12.

Figure 5:
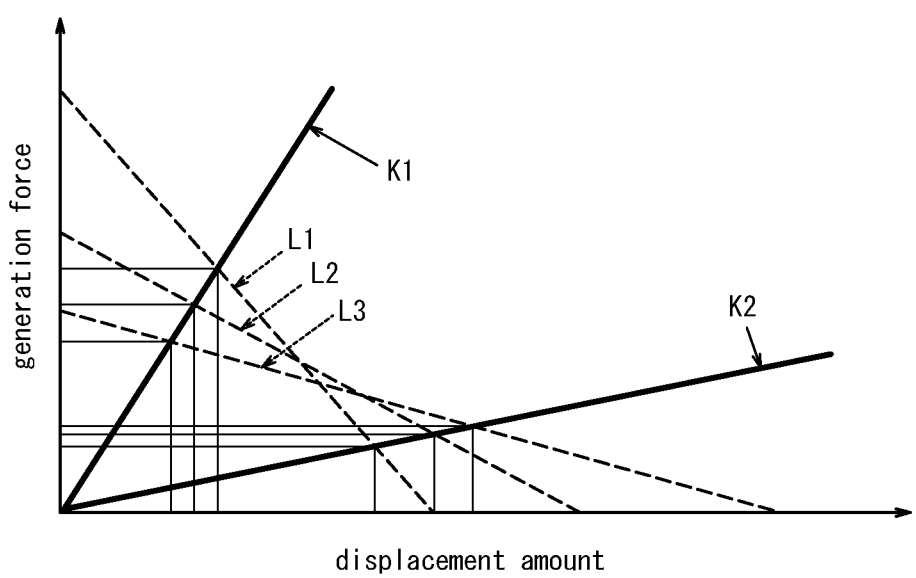
FIG. 5 is a diagram illustrating the driving characteristics of the actuator.

In the actuator 10 of this disclosure, the driving characteristics are determined on the basis of the spring constant K of the diaphragm 12 and the effective length L of the diaphragm 12 between the first spacer 13A and the second spacer 13B illustrated in FIG. 2. FIG. 5 is a diagram illustrating the driving characteristics of the actuator 10. The vertical axis indicates the generation force of the diaphragm 12. The horizontal axis indicates the displacement amount of the diaphragm 12. K1 and K2 indicate the spring constant of the diaphragm 12, where K1>K2. L1, L2 and L3 indicate the effective length of the diaphragm 12, where L1<L2<L3.

As is obvious from FIG. 5, as the spring constant K of the diaphragm 12 increases, the displacement amount of the diaphragm 12 tends to decrease and the generation force tends to increase. Further, the displacement amount tends to increase as the effective length L is shorter as for the spring constant K1, whereas it tends to increase as the effective length L is longer as for the spring constant K2. Therefore, if the spring constant K is appropriately set so that the driving characteristics vary depending on the effective length L, the driving characteristics optimal for the specifications of the vibration object 2 can be obtained by adjusting the effective length L. In addition, individual difference of the vibration object 2 of the same specifications is absorbed by adjusting the effective length L, and the optimal driving characteristics can be obtained.

Figure 6A:
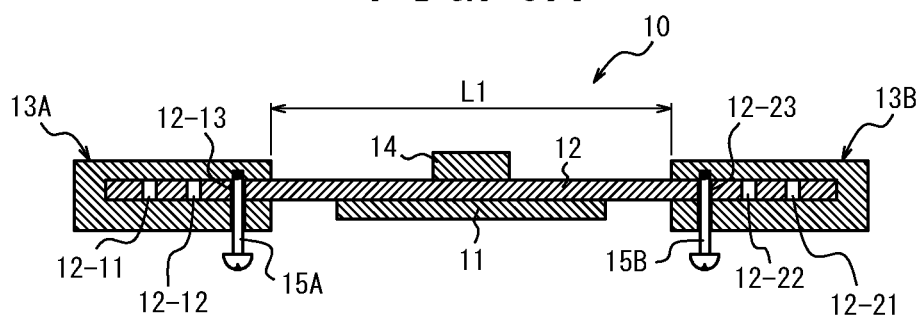
FIG. 6A is a diagram illustrating an example of a variable effective length of a diaphragm of the actuator.
Figure 6B:
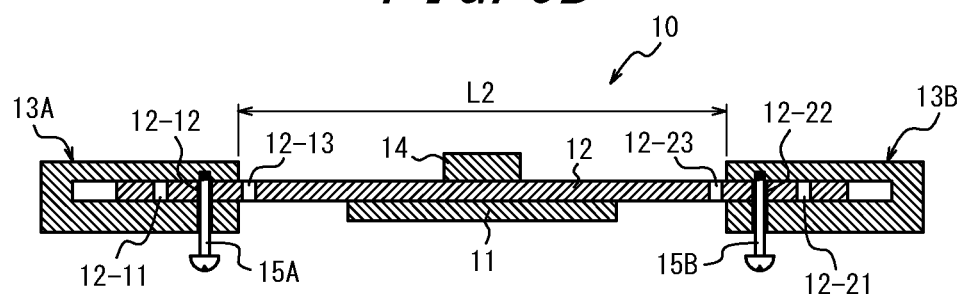
FIG. 6B is a diagram illustrating an example of a variable effective length of a diaphragm of the actuator.
Figure 6C:
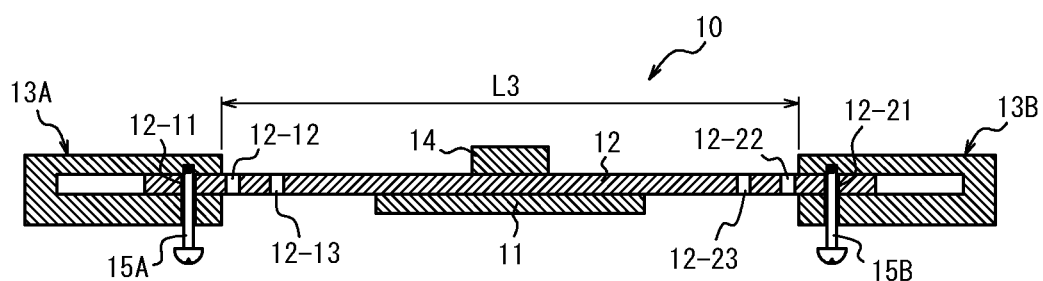
FIG. 6C is a diagram illustrating an example of a variable effective length of a diaphragm of the actuator.

The actuator 10 of this disclosure has three through holes 12-11, 12-12 and 12-13; 12-21, 12-22, 12-23, respectively, at both ends of the diaphragm 12. Therefore, as illustrated in FIG. 6A, the effective length L of the diaphragm 12 can be the shortest, which is L1, by fixing the actuator 10 to the base member 5 by passing the fixing screws 15A and 15B through the inner through holes 12-13 and 12-23, respectively. Further, as illustrated in FIG. 6B, the effective length L of the diaphragm 12 can be a medium length L2 by fixing the actuator 10 to the base member 5 by passing the fixing screws 15A and 15B through the central through holes 12-12 and 12-22, respectively. Further, as illustrated in FIG. 6C, the effective length L of the diaphragm 12 can be L3, which is the longest, by fixing the actuator 10 to the base member 5 by passing the fixing screws 15A and 15B through the outer through holes 12-11 and 12-21, respectively.

According to the actuator 10 of this disclosure, the effective length L of the diaphragm 12 can be adjusted in three stages in a symmetrical combination with respect to the piezoelectric element 11. Further, if asymmetrical combinations with respect to the piezoelectric element 11 are added, adjustment can be made in more stages. In this manner, the relative position between the diaphragm 12 and the first spacer 13A and the second spacer 13B is adjusted according to the specifications of the vibration object 2 to appropriately set the effective length L of the diaphragm 12, and as a result the actuator 10 of this disclosure can obtain the optimal driving characteristics. Therefore, the versatility of the actuator 10 can be improved and the cost can be reduced. Further, in the actuator 10 of this disclosure, the individual difference of the vibration object 2 of the same specifications is absorbed by adjusting the effective length L of the diaphragm 12, and as a result the optimal driving characteristics can be obtained.

Further, the actuator 10 is fixed to the base member 5 by screwing the fixing screws 15A and 15B into the female thread 13A-5 of the first spacer 13A and the female thread 13B-5 of the second spacer 13B, respectively. Therefore, compared with the case where the female threads 13A-5 and 13B-5 are used as through holes and nuts are screwed to the fixing screws 15A and 15B, respectively, to fix the actuator 10, the work of aligning the nuts with respect to the fixing screws 15A and 15B is not needed any more, which facilitates the installation work of the actuator 10.

Second Embodiment

FIG. 7 is a cross-sectional view of the actuator 10 according to a second embodiment of this disclosure. In the actuator 10 of this disclosure, the configuration of the diaphragm 12 and the configurations of the first spacer 13A and the second spacer 13B are different from those of the first embodiment. Since the other configurations are the same as the first embodiment, the different points will be described below.

One end of the diaphragm 12 is formed with one through hole 12-1 through which the fixing screw 15A can pass. In the same manner, the other end of the diaphragm 12 is formed with one through hole 12-2 through which the fixing screw 15B can pass. The through holes 12-1 and 12-2 are formed symmetrically with respect to the piezoelectric element 11, at the central portion in the Z direction of the diaphragm 12, for example.

The fixing screw 15A passes through the through hole 5A formed in the base member 5, the through hole 13A-4 of the first spacer 13A and the through hole 12-1 at one end of the diaphragm 12, and is screwed into the female thread 13A-5 of the first spacer 13A. In the same manner, the fixing screw 15B passes through the through hole 5B formed in the base member 5, the through hole 13B-4 of the second spacer 13B and the through hole 12-2 at the other end of the diaphragm 12, and is screwed into the female thread 13B-5 of the second spacer 13B. In this manner, both ends of the diaphragm 12 are clamped between the first spacer 13A and the second spacer 13B, respectively, and thus the actuator 10 is fixed to the base member 5.

Figure 8A:
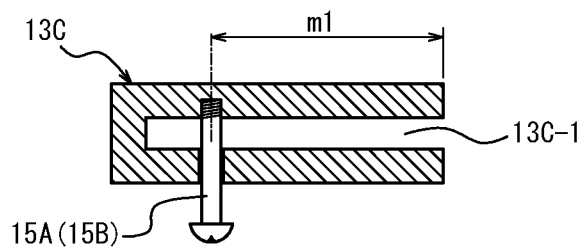
FIG. 8A illustrates an example of a spacer selectively usable for the actuator.
Figure 8B:
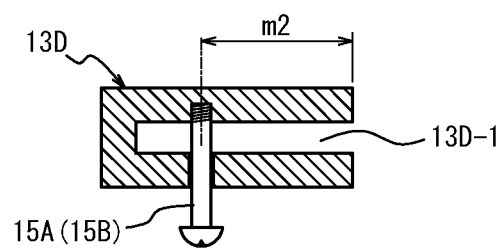
FIG. 8B illustrates an example of a spacer selectively usable for the actuator.
Figure 8C:
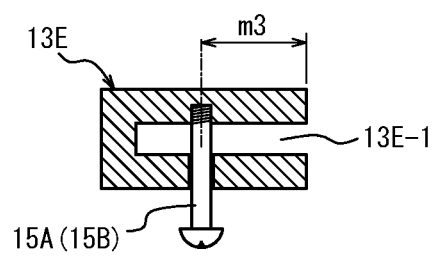
FIG. 8C illustrates an example of a spacer selectively usable for the actuator.

The first spacer 13A and the second spacer 13B are selected from three types of spacers such as 13C, 13D and 13E illustrated in FIGS. 8A, 8B and 8C, for example, according to the specifications of the vibration object 2 and are used. The spacers 13C, 13D and 13E have m1, m2 and m3 different from each other. These are the lengths from the opening end (entrance) of the recesses 13C-1, 13D-1 and 13E1 into which the end of the diaphragm 12 is inserted to the position where the fixing screw 15A or 15B is inserted and screwed. That is, the insertion lengths of the end of the diaphragm 12 are different from each other, and m1>m2>m3. The spacers 13C, 13D and 13E are prepared as a set of at least two each, together with other components of the actuator 10, for example.

Figure 9A:
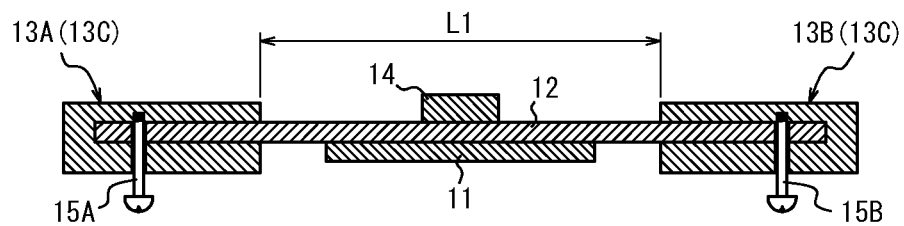
FIG. 9A is a diagram illustrating an example of a variable effective length of the diaphragm of the actuator.
Figure 9B:
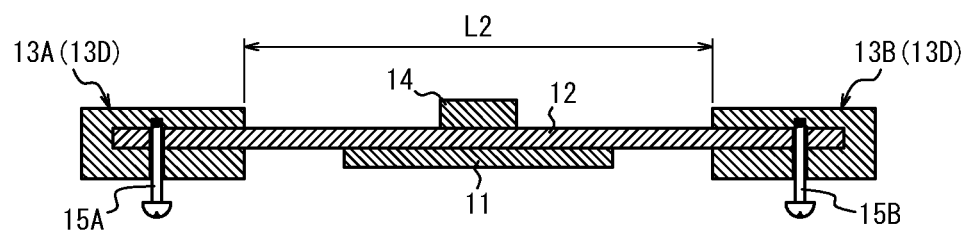
FIG. 9B is a diagram illustrating an example of a variable effective length of the diaphragm of the actuator.
Figure 9C:
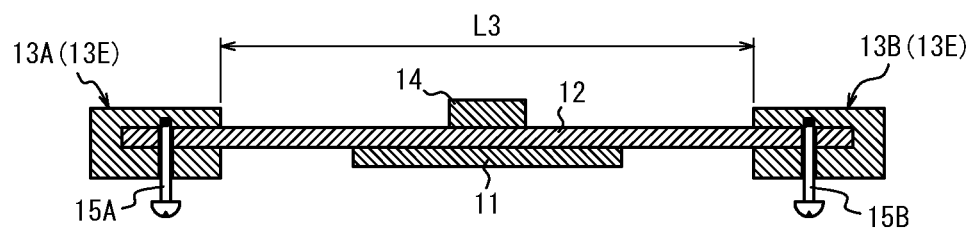
FIG. 9C is a diagram illustrating an example of a variable effective length of the diaphragm of the actuator.

In the actuator 10 of this disclosure, as illustrated in FIG. 9A, when two spacers 13C are used as the first spacer 13A and the second spacer 13B to fix the actuator 10 to the base member 5, the effective length L of the diaphragm 12 can be L1, which is the shortest. Further, as illustrated in FIG. 9B, when two spacers 13D are used as the first spacer 13A and the second spacer 13B to fix the actuator 10 to the base member 5, the effective length L of the diaphragm 12 can be L2, which is the medium length. Further, as illustrated in FIG. 9C, when two spacers 13E are used as the first spacer 13A and the second spacer 13B to fix the actuator 10 to the base member 5, the effective length L of the diaphragm 12 can be L3, which is the longest.

According to the actuator 10 of this disclosure, if the same set of spacers is used for both ends of the diaphragm 12, the effective length L of the diaphragm 12 can be adjusted in 3 stages. Further, if different sets of spacers are used for both ends of the diaphragm 12, further adjustments in other stages are possible. In this manner, the optimal spacer is selected according to the specifications of the vibration object 2, and the position of the diaphragm 12 relative to the first spacer 13A and the second spacer 13B is adjusted, and as a result the effective length L of the diaphragm 12 is set as appropriate, and the optimal driving characteristics can be obtained. Therefore, the versatility of the actuator 10 can be improved and the cost can be reduced. Further, in the actuator 10 of this disclosure, the individual difference of the vibration object 2 of the same specifications is absorbed by adjusting the effective length L of the diaphragm 12, and thus the optimal driving characteristics can be obtained. Further, as with the first embodiment, since the actuator 10 is fixed to the base member 5 by screwing the fixing screws 15A and 15B into the female thread 13A-5 of the first spacer 13A and the female thread 13B-5 of the second spacer 13B, respectively, the installation work will be facilitated.

Figure 10:
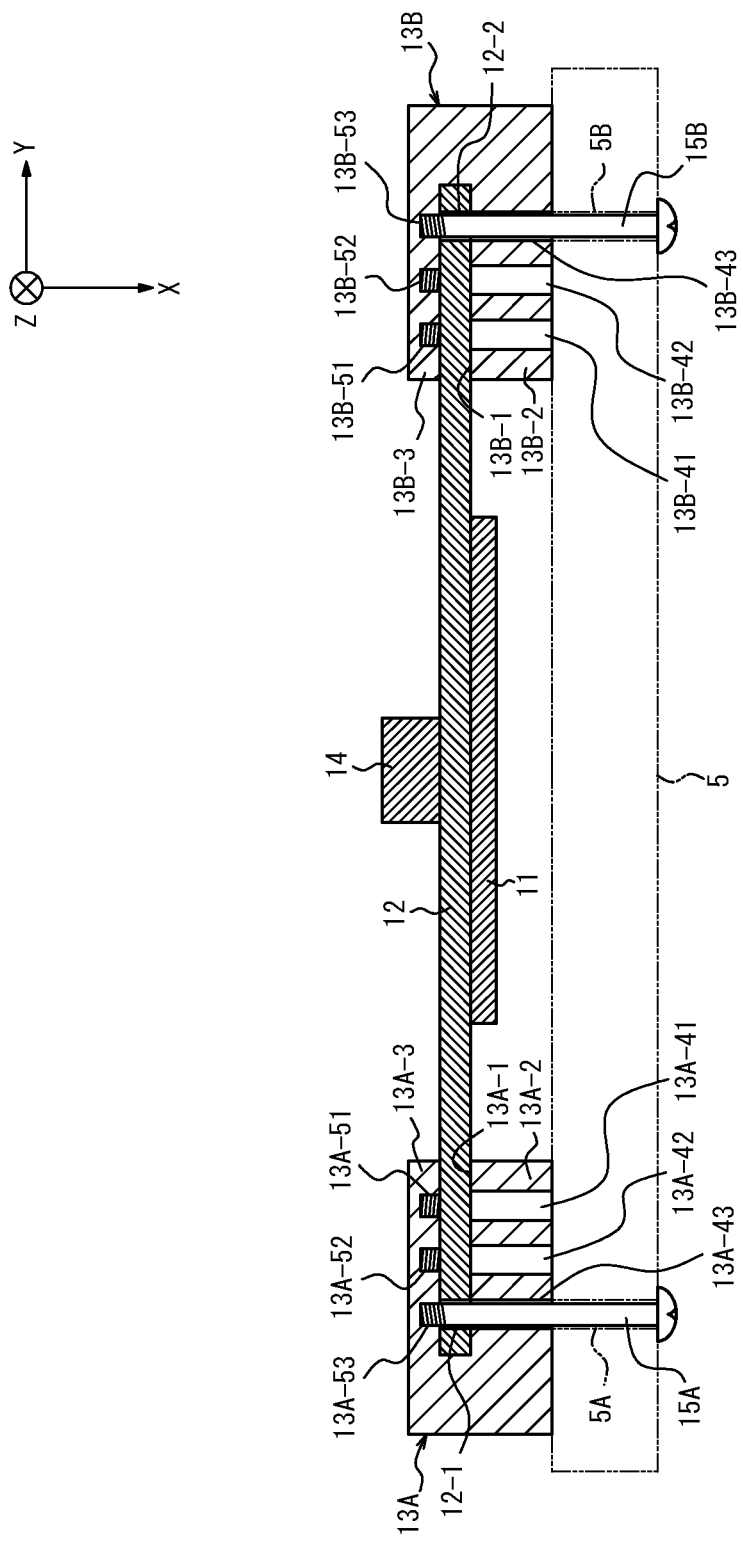
FIG. 10 is a cross-sectional view of the actuator.

FIG. 10 is a cross-sectional view of the actuator 10 according to a third embodiment of this disclosure. In the actuator 10 of this disclosure, the configuration of the diaphragm 12 and the configuration of the first spacer 13A and the second spacer 13B are different from those of the first embodiment. Since the other configurations are the same as the first embodiment. the different points will be described below.

The diaphragm 12 is formed in the same manner as the second embodiment. That is, one end of the diaphragm 12 is formed with one through hole 12-1 through which the fixing screw 15A can pass. In the same manner, the other end of the diaphragm 12 is formed with one through hole 12-2 through which the fixing screw 15B can pass. The through holes 12-1 and 12-2 are formed symmetrically with respect to the piezoelectric element 11, at the central portion in the Z direction of the diaphragm 12, for example.

In the first spacer 13A, a plurality of through holes through which the fixing screw 15A can pass are formed in the flat portion 13A-2. In the actuator 10 of this disclosure, at the central portion in the Z direction, three through holes 13A-41, 13A-42 and 13A-43 are formed in the flat portion 13A-2. The three through holes are arranged side by side in the Y direction from the entrance of the recess 13A-1 toward the inner part thereof. Further, in the flat portion 13A-3 of the first spacer 13A, the female threads 13A-51, 13A-52 and 13A-53 into which the fixing screw 15A is screwed are formed coaxially with through holes 13A-41, 13A-42 and 13A-43, respectively.

In the same manner, three through holes 13B-41, 13B-42 and 13B-43 are formed in the flat portion 13B-2 of the second spacer 13B. The three through holes are arranged from the entrance of the recess 13A-1 toward the inner part thereof. Further, in the flat portion 13B-3 of the second spacer 13B, the female threads 13B-51, 13B-52 and 13B-53 into which the fixing screw 15A is screwed are formed coaxially with through holes 13B-41, 13B-42 and 13B-43, respectively.

Figure 11A:
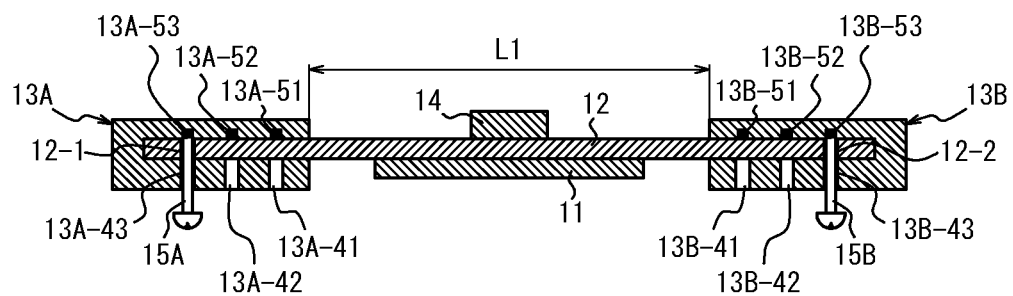
FIG. 11A is a diagram illustrating an example of a variable effective length of the diaphragm of the actuator.
Figure 11B:
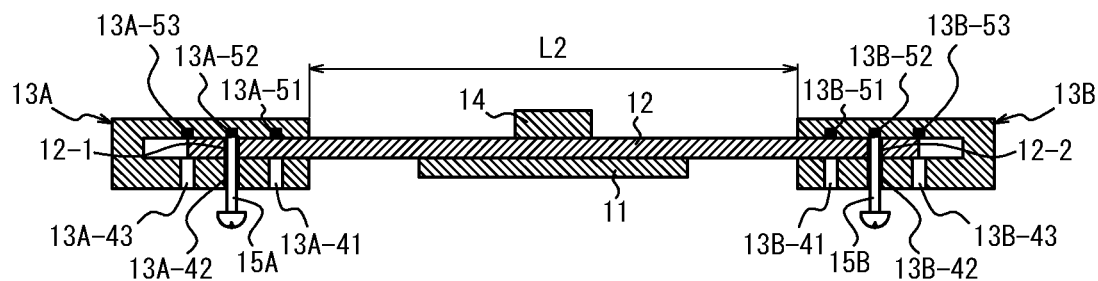
FIG. 11B is a diagram illustrating an example of a variable effective length of the diaphragm of the actuator.
Figure 11C:
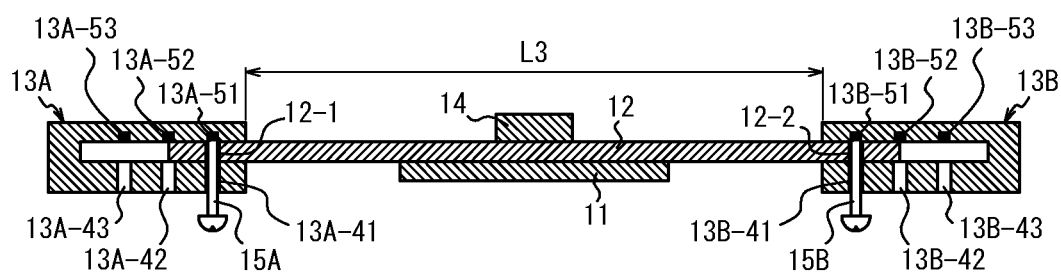
FIG. 11C is a diagram illustrating an example of a variable effective length of the diaphragm of the actuator.

The actuator 10 of this disclosure has through holes 12-1 and 12-2 at both ends of the diaphragm 12, respectively. Further, the first spacer 13A and the second spacer 13B have, respectively, three through holes 13A-41, 13A-42 and 13A-43 and three through holes 13B-41, 13B-42 and 13B-43 and three female threads 13A-51, 13A-52 and 13A-53 and three female threads 13B-51, 13B-52 and 13B-53. Therefore, as illustrated in FIG. 11A, when the fixing screws 15A and 15B are passed through the through holes 13A-43 and 13B-43, located at the inner parts of the recesses 13A-1 and 13B-1 of the first spacer 13A and the second spacer 13B, respectively, to fix the actuator 10 to the base member 5, the effective length L of the diaphragm 12 can be L1, which is the shortest. Further, as illustrated in FIG. 11B, when the fixing screws 15A and 15B are passed through the through holes 13A-42 and 13B-42 located at the center, respectively, to fix the actuator 10 to the base member 5, the effective length L of the diaphragm 12 can be L2, which is a medium length. Further, as illustrated in FIG. 11C, when the fixing screws 15A and 15B are passed through the through holes 13A-41 and 13B-41 located each on the entrance side to fix the actuator 10 to the base member 5, the effective length L of the diaphragm 12 can be L3, which is the longest.

According to the actuator 10 of this disclosure, as with the first embodiment, the effective length L of the diaphragm 12 can be adjusted in three stages with combinations symmetrical with respect to the piezoelectric element 11. Further, when asymmetrical combinations with respect to the piezoelectric element 11 are included, adjustment in other stages will be possible. In this manner, when the effective length L of the diaphragm 12 is set appropriately by adjusting the position of the diaphragm 12 relative to the first spacer 13A and the second spacer 13B according to the specifications of the vibration object 2, the actuator 10 of this disclosure can obtain the optimal driving characteristics. Therefore, the versatility of the actuator 10 can be improved and the cost can be reduced. Further, in the actuator 10 of this disclosure, when the effective length L of the diaphragm 12 is appropriately adjusted, the individual difference of the vibration object 2 of the same specifications is absorbed, and the optimal driving characteristics can be obtained. In addition, as with the first embodiment and the second embodiment, since the actuator 10 is fixed to the base member 5 by screwing the fixing screws 15A and 15B into corresponding female threads of the first spacer 13A and the second spacer 13B, respectively, installation work can be made easy.

Although this disclosure has been described on the basis of the drawings and the examples, it is to be noted that various changes and modifications may be made easily by those who are ordinarily skilled in the art on the basis of this disclosure. Accordingly, it is to be noted that such changes and modifications are included in the scope of this disclosure. For example, functions and the like included in each function part can be rearranged without logical inconsistency, and a plurality of function parts can be combined into one or divided. Each embodiment according to the above described disclosure is not limited to being faithfully implemented in accordance with the above described each embodiment, and may be implemented by appropriately combining each feature or omitting a part thereof.

For example, in the above described embodiment, the vibration object 2 is described to be vibrated vertically by the actuator 10. However, the vibration object 2 may be vibrated horizontally by the actuator 10. In this case, the actuator 10 is fixed to the base member such that the main face 12a illustrated in FIG. 4 will be vertical to the main face 2a of the vibration object 2 illustrated in FIG. 2.

In the first embodiment, the number of through holes of the fixing screws 15A and 15B formed at both ends of the diaphragm 12 of the actuator 10 is not limited to three, and may be two or four or more. In the same manner, in the second embodiment, the types of spacers having different insertion lengths at the ends of the diaphragm 12 are not limited to three types, and may be two types or four or more types. Further, in the third embodiment, a set of the through holes of the fixing screws 15A and 15B formed in the first spacer 13A and the second spacer 13B and the female threads is not limited to three sets, and may be two sets or four or more sets.

In the above embodiment, the female threads of the first spacer 13A and the second spacer 13B may be formed so as to pass through the flat portion 13A-3 and the flat portion 13B-3, respectively.

In the above embodiment, the female threads of the first spacer 13A and the second spacer 13B may be through holes. In this case, the screw ends of the fixing screws 15A and 15B pass through the first spacer 13A and the second spacer 13B, respectively, and protrude. Then, the actuator 10 can be fixed to the base member by loosely fitting a washer or the like to each of the fixing screws 15A and 15B, and then screwing a nut.

Further, when fixing the actuator 10 to the base member by screwing a nut to each of the fixing screws 15A and 15B, the first spacer 13A may be formed of a flat portion 13A-2 located between the diaphragm 12 and the base member 5, omitting the recess 13A-1 and the flat portion 13A-3. The second spacer 13B is configured in the same manner as the first spacer 13A. In this case, the diaphragm 12 is placed on the first spacer 13A and the second spacer 13B having ends formed of the flat portions 13A-2 and 13B-2, respectively. Then, if necessary, a washer or the like is loosely fitted to the screw end of the fixing screw 15A that passes through one end of the first spacer 13A and the diaphragm 12, and then a nut is screwed. Further, for the second spacer 13B, a nut is screwed to the fixing screw 15B in the same manner as the first spacer 13A. In this manner, the actuator 10 is fixed to the base member.

Figure 12:
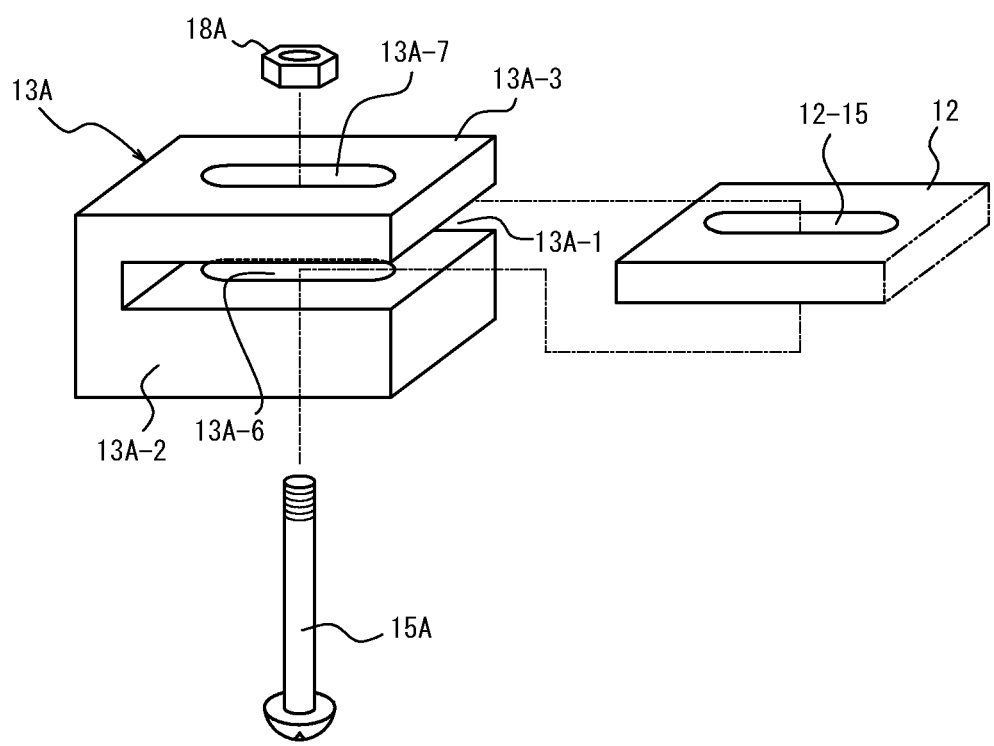
FIG. 12 is a perspective view illustrating a configuration of main parts of a variation of the actuator.

In the actuator 10 described in the above embodiment, the effective length L of the diaphragm 12 can be adjusted in stages. However, the effective length L may be continuously adjustable. In this case, the diaphragm 12, the first spacer 13A and the second spacer 13B can be configured as illustrated in FIG. 12, for example. FIG. 12 illustrates a partial perspective view of one end of the diaphragm 12 and the first spacer 13A.

In FIG. 12, a long hole 12-15 through which the fixing screw 15A can pass is formed at one end of the diaphragm 12. The long hole 12-15 is formed, for example, in the central portion of the diaphragm 12 in the Z direction, along the Y direction, which is the longitudinal direction. A long hole similar to the long hole 12-15 is also formed at the other end of the diaphragm 12 at symmetrical positions with respect to the piezoelectric element 11, for example.

As with the first embodiment, the first spacer 13A is formed in a U shape having a recess 13A-1 and a pair of flat portions 13A-2 and 13A-3 facing each other via the recess 13A-1. Long holes 13A-6 and 13A-7 through which the fixing screw 15A passes are formed in the flat portions 13A-2 and 13A-3, respectively. The long holes 13A-6 and 13A-7 are formed in the central portion of the first spacer 13A in the Z direction, for example, along the Y direction so as to overlap in the X direction.

The fixing screw 15A passes through the base member 5, then passes through the long hole 13A-6 of the first spacer 13A, the long hole 12-15 of the diaphragm 12 and the long hole 13A-7 of the first spacer 13A, and is inserted. Then, if necessary, a washer or the like is loosely fitted to the fixing screw 15A, and then the nut 18A is screwed to fix the first spacer 13A to the base member 5. If necessary, a washer or the like is loosely fitted to the fixing screw 15A, and then the nut 18A is screwed to fix the first spacer 13A to the base member 5. The second spacer 13B is also fixed to the base member 5 in the same manner, and the actuator 10 is fixed to the base member 5.

According to such a configuration, in order to fix the actuator 10 to the base member 5, the position of the diaphragm 12 relative to the first spacer 13A and the second spacer 13B is continuously variable by moving at least one of the first spacer 13A and the second spacer 13B in the Y direction. In this manner, the effective length L of the diaphragm 12 can be continuously adjusted. Therefore, as with the above described embodiment, since it is possible to correspond to changes in the specifications of the vibration object 2, the versatility of the actuator 10 can be increased, and the cost can be reduced. In addition, in the actuator 10 of this disclosure, since the effective length L of the diaphragm 12 can be adjusted continuously, the effective length L can be set more appropriately in response to changes in the specifications of the vibration object 2 and individual differences. As a result more suitable driving characteristics can be obtained.

It is to be noted that, in such a configuration, the first spacer 13A may be formed of the flat portion 13A-2 located between the diaphragm 12 and the base member 5, omitting the recess 13A-1 and the flat portion 13A-3. The second spacer 13B may be configured in the same manner as the first spacer 13A.

The actuator 10 of this disclosure is fixed to the base member 5 by using the fixing screws 15A and 15B. However, the actuator 10 is not fixed not only by screws, but also by an adhesive. In this case, first, the first spacer 13A and the second spacer 13B are moved relative to the diaphragm 12 to adjust the effective length of the diaphragm 12 to an effective length that provides the desired characteristics. After that, the diaphragm 12, the first spacer 13A and the second spacer 13B may be fixed with an adhesive, and the first spacer 13A and the second spacer 13B may be fixed to the base member 5 with an adhesive.

The configuration described in the above-described embodiment and the configuration described in the variation may be combined as appropriate.

The invention claimed is:

1. An actuator, comprising:
a piezoelectric element;
a diaphragm to which the piezoelectric element is bonded, and which vibrates according to expansion and contraction displacement of the piezoelectric element; and
a first spacer and a second spacer configured to fix both ends of the diaphragm in an expansion and contraction displacement direction of the piezoelectric element to a base member, wherein
driving characteristics of the actuator are determined by an effective length of the diaphragm between the first spacer and the second spacer,
the diaphragm has at least one through hole at each of the both ends,
each of the first spacer and the second spacer has at least one through hole, and
a fixing screw is configured to pass through the at least one through hole of the respective end of the diaphragm and the at least one through hole of the respective one of the first spacer and the second spacer.

2. The actuator according to claim 1, wherein
the diaphragm has a plurality of through holes spaced from each other in the expansion and contraction displacement direction at each of the both ends, and the effective length of the diaphragm is adjustable by passing the fixing screw through the at least one through hole of the respective one of the first spacer and the second spacer and one of the plurality of the through holes of the respective end of the diaphragm.

3. The actuator according to claim 1, wherein
each of the first spacer and the second spacer is selected from a plurality of spacers having different lengths from the at least one through hole of the respective one of the first spacer and the second spacer to an inner end of the respective one of the first spacer and the second spacer in the expansion and contraction displacement direction, and the effective length of the diaphragm is adjustable by selecting one of the plurality of spacers as each of the first spacer and the second spacer.

4. The actuator according to claim 1, wherein
each of the first spacer and the second spacer has a plurality of through holes spaced from each other in the expansion and contraction displacement direction, and the effective length of the diaphragm is adjustable by passing the fixing screw through the at least one through hole of the respective end of the diaphragm and one of the plurality of through holes of each of the first spacer and the second spacer.

5. The actuator according to claim 1, wherein
the at least one through hole of each of the first spacer and the second spacer and the at least one through hole of each of the both ends of the diaphragm are elongated in the expansion and contraction displacement direction, and
the effective length of the diaphragm is adjustable by moving the first spacer and the second spacer relative to the diaphragm in the expansion and contraction displacement direction.

6. The actuator according to claim 1, wherein
each of the first spacer and the second spacer has a U-shape having a recess and a pair of flat portions facing each other with the recess therebetween,
the respective end of the diaphragm is removably inserted into the recess of the respective one of the first spacer and the second spacer, and
the at least one through hole of each of the first spacer and the second spacer is provided at at least one of the pair of flat portions.

7. The actuator according to claim 1, wherein
the base member has two through holes, and
the fixing screw passes through the at least one through hole of the respective end of the diaphragm, the at least one through hole of the respective one of the first spacer and the second spacer, and respective one of the two through holes of the base member.

8. The actuator according to claim 1, further comprising
a holder provided on a surface of the diaphragm opposite to a surface to which the piezoelectric element is bonded and configured to hold a vibration object to be vibrated by the actuator.

9. A tactile sensation providing apparatus, comprising a vibration object configured to provide tactile sensation and an actuator,
the actuator having:
a piezoelectric element;
a diaphragm to which the piezoelectric element is bonded, and which vibrates according to expansion and contraction displacement of the piezoelectric element; and
a first spacer and a second spacer configured to fix both ends of the diaphragm in expansion and contraction displacement direction of the piezoelectric element to a base member, wherein
driving characteristics of the actuator are determined by an effective length of the diaphragm between the first spacer and the second spacer,
the diaphragm has at least one through hole at each of the both ends,
each of the first spacer and the second spacer has at least one through hole, and
a fixing screw is configured to pass through the at least one through hole of the respective end of the diaphragm and the at least one through hole of the respective one of the first spacer and the second spacer.

10. The tactile sensation providing apparatus according to claim 9, wherein
the diaphragm has a plurality of through holes spaced from each other in the expansion and contraction displacement direction at each of the both ends, and the effective length of the diaphragm is adjustable by passing the fixing screw through the at least one through hole of the respective one of the first spacer and the second spacer and one of the plurality of the through holes of the respective end of the diaphragm.

11. The tactile sensation providing apparatus according to claim 9, wherein
each of the first spacer and the second spacer is selected from a plurality of spacers having different lengths from the at least one through hole of the respective one of the first spacer and the second spacer to an inner end of the respective one of the first spacer and the second spacer in the expansion and contraction displacement direction, and
the effective length of the diaphragm is adjustable by selecting one of the plurality of spacers as each of the first spacer and the second spacer.

12. The tactile sensation providing apparatus according to claim 9, wherein
each of the first spacer and the second spacer has a plurality of through holes spaced from each other in the expansion and contraction displacement direction, and
the effective length of the diaphragm is adjustable by passing the fixing screw through the at least one through hole of the respective end of the diaphragm and one of the plurality of through holes of each of the first spacer and the second spacer.

13. The tactile sensation providing apparatus according to claim 9, wherein
the at least one through hole of each of the first spacer and the second spacer and the at least one through hole of each of the both ends of the diaphragm are elongated in the expansion and contraction displacement direction, and
the effective length of the diaphragm is adjustable by moving the first spacer and the second spacer relative to the diaphragm in the expansion and contraction displacement direction.

14. The tactile sensation providing apparatus according to claim 9, wherein
each of the first spacer and the second spacer has a U-shape having a recess and a pair of flat portions facing each other with the recess therebetween,
the respective end of the diaphragm is removably inserted into the recess of the respective one of the first spacer and the second spacer, and
the at least one through hole of each of the first spacer and the second spacer is provided at at least one of the pair of flat portions.

15. The tactile sensation providing apparatus according to claim 9, wherein
the base member has two through holes, and
the fixing screw passes through the at least one through hole of the respective end of the diaphragm, the at least one through hole of the respective one of the first spacer and the second spacer, and respective one of the two through holes of the base member.

16. The tactile sensation providing apparatus according to claim 9, further comprising
a holder provided on a surface of the diaphragm opposite to a surface to which the piezoelectric element is bonded and configured to hold the vibration object to be vibrated by the actuator.

* * * * *